(12) United States Patent
Baier et al.

(10) Patent No.: US 7,689,865 B2
(45) Date of Patent: Mar. 30, 2010

(54) MIDDLESOFT COMMANDER

(75) Inventors: Heinz Baier, Sindelfingen (DE); Christopher R. Conley, Pflugerville, TX (US); Brian Flachs, Georgetown, TX (US); Michael T. Saunders, Round Rock, TX (US); Steven J. Smolski, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 584 days.

(21) Appl. No.: 11/470,478

(22) Filed: Sep. 6, 2006

(65) Prior Publication Data

US 2008/0126895 A1 May 29, 2008

(51) Int. Cl.
*G06F 11/00* (2006.01)
(52) U.S. Cl. .......................................... 714/30; 714/28
(58) Field of Classification Search .................... 714/30, 714/28
See application file for complete search history.

(56) References Cited

U.S. PATENT DOCUMENTS

| | | | | |
|---|---|---|---|---|
| 6,223,144 B1* | 4/2001 | Barnett et al. .................. 703/22 |
| 6,883,109 B2* | 4/2005 | Erickson et al. ................ 714/5 |
| 7,089,175 B1* | 8/2006 | Nemecek et al. ............... 703/28 |
| 7,096,385 B1* | 8/2006 | Fant et al. ..................... 714/30 |
| 7,149,927 B2* | 12/2006 | Stancil ......................... 714/31 |
| 2004/0221201 A1* | 11/2004 | Seroff ........................... 714/30 |
| 2004/0225783 A1* | 11/2004 | Erickson et al. .............. 710/200 |
| 2008/0307260 A1* | 12/2008 | Kang et al. .................... 714/27 |

* cited by examiner

*Primary Examiner*—Marc Duncan
(74) *Attorney, Agent, or Firm*—Matthew B. Talpis; Eustace P. Isadore

(57) ABSTRACT

A method, device, system, and computer program product for enabling advanced control of debugging processes on a JTAG (Joint Test Action Group) IEEE 1149.1 capable device (or system under test (SUT)). Middlesoft Commander is provided within a JTAG-enabled (or JTAG) POD, which is connected to both a host system executing debugging software and the SUT. The communication between the POD and the SUT is enabled with a pair of JTAG interfaces bridging the connection between the POD and the SUT. Middlesoft Commander comprises code that enables Middlesoft Commander to convert high level commands (debug packets) received from (or generated by) the host system into JTAG commands. These JTAG commands are forwarded to the SUT. Middlesoft Commander further comprises code that enables Middlesoft Commander to convert the JTAG data received from the SUT into commands recognizable by the host system.

17 Claims, 2 Drawing Sheets

MIDDLESOFT COMMANDER

CROSS REFERENCE TO RELATED APPLICATIONS

The present application is related to the following U.S. Patent Applications filed concurrently herewith: U.S. patent application Ser. No. 11/470,497; U.S. patent application Ser. No. 11/470,507; and U.S. patent application Ser. No. 11/470,282. The above-mentioned patent applications are assigned to the assignee of the present invention and are incorporated herein by reference in their entirety.

BACKGROUND OF THE INVENTION

1. Technical Field

The present invention relates generally to computer devices and in particular to mechanisms for debugging computer devices. Still more particularly, the present invention relates to a method and device for providing enhanced debugging of JTAG-supported devices.

2. Description of the Related Art

Joint Test Action Group (JTAG) is the name commonly utilized for the IEEE 1149.1 standard (1990), with full name being "Standard Test Access Port and Boundary-Scan Architecture." In one implementation, JTAG is provided within test access ports that are tulized for testing printed circuit boards via boundary scan. JTAG is currently being primarily used for testing sub-blocks of integrated circuits. JTAG is also used as a mechanism for debugging embedded systems, and provides a convenient "back door" into these system. When utilized as a debugging tool, an in-circuit emulator, which uses JTAG as the transport mechanism, enables a programmer to access an on-chip debug module, which is integrated into the CPU via JTAG. The debug module enables the programmer to debug the software of the embedded system.

One conventional method by which hardware-level debuggin operations are completed is by use of a device referred to as a POD. A POD is a hardware device, such as a system controller, that is self-initialized and may comprise a version of embedded Linux as its operating system. Use of conventional PODs adds an additional device to the overall test bench setup in a pre-JTAG environment, and the PODs are no longer being manufactured. Also, conventional PODs do not support JTAG debugging of a device under test. Since the PODs are no longer being manufactured, conventional debug methods continue to scan through the IEEE JTAG 1149.1 utilizing a system controller as a POD.

Consequently, the present invention recognizes that a software-level solution is required in order to continue being able to scan through the IEEE JTAG 1149.1 device for debugging purposes using a POD as the system controller. Software-enabled enhancements in the application of these JTAG PODs to enable advanced and/or more efficient debugging functions would be a welcomed development to existing methods that utilized conventional JTAG PODs to complete the connectivity to the device, which is to undergo the debug operation. With the movement away from continuing to manufacture PODS, the present invention recognizes and addresses the inherent problems in enabling debugging of JTAG devices that require these PODS for connectivity to a host system running the debug program.

SUMMARY OF THE INVENTION

Disclosed are a method, device, system, and computer program product for enabling advanced control of debugging processes on a JTAG (Joint Test Action Group) IEEE 1149.1 capable device (hereinafter referred to as a system under test (SUT)). A high level software utility called Middlesoft Commander is provided within a JTAG-enabled (or JTAG) POD. The JTAG POD operates as a system controller and is connected to both a host system on which the debugging software is executed and with the SUT. The communication between the POD and the host system and the POD and the SUT is enabled via separate communication/connection links, with a pair of JTAG interfaces bridging the connection between the POD and the SUT.

Middlesoft Commander comprises code that enables Middlesoft Commander to convert high level commands (debug packets) received from (or generated by) the host system into JTAG commands. These JTAG commands are forwarded to the SUT, where they are executed to detect and/or generate JTAG data about the operational attributes/parameters of the SUT. Middlesoft Commander further comprises code that enables Middlesoft Commander to convert the JTAG data received from the SUT into commands recognizable by the host system. Once the conversion is complete, Middlesoft Commander forwards the converted data to the host system.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a method, device, system, and computer program product for enabling advanced control of debugging processes on a JTAG (Joint Test Action Group) IEEE 1149.1 capable device (hereinafter referred to as a system under test (SUT)). A high level software utility called Middlesoft Commander is provided within a JTAG-enabled (or JTAG) POD. The JTAG POD operates as a system controller and is connected to both a host system on which the debugging software is executed and with the SUT. The communication between the POD and the host system and the POD and the SUT is enabled via separate communication/connection links, with a pair of JTAG interfaces bridging the connection between the POD and the SUT.

Middlesoft Commander comprises code that enables Middlesoft Commander to convert high level commands (debug packets) received from (or generated by) the host system into JTAG commands. These JTAG commands are forwarded to the SUT, where they are executed to detect and/or generate JTAG data about the operational attributes/parameters of the SUT. Middlesoft Commander further comprises code that enables Middlesoft Commander to convert the JTAG data received from the SUT into commands recognizable by the host system. Once the conversion is complete, Middlesoft Commander forwards the converted data to the host system.

Figure 1A:
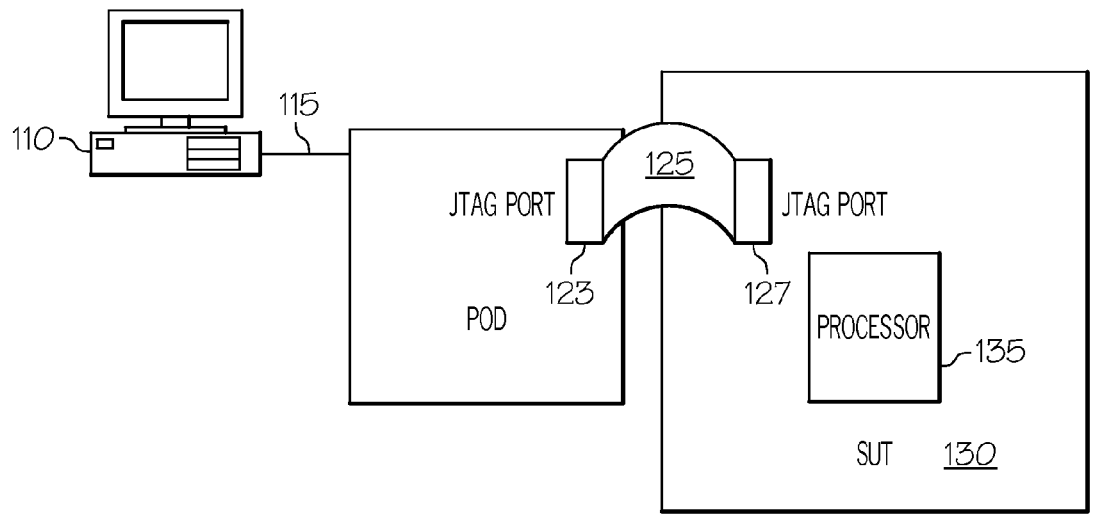
FIG. 1A is a block diagram illustrating the connectivity among host system, a POD with Middlesoft Commander, and IEEE 1149.1 capable system under test (SUT), in accordance with one embodiment of the invention.

With reference now to the figures, and in particular FIG. 1A, wherein is illustrated an example system configuration according to one embodiment of the invention. Three main components are provided within the overall system, namely host system 110, JTAG POD 120, and SUT 130. Host system 110 is communicatively coupled to JTAG POD 120 via a communication link 115, on which a communication protocol for packet transmission is supported. SUT 130 is also communicatively coupled to JTAG POD 120 via a second communication link 125, which may be a special connection cable. Communication link 125 is coupled at one end to first JTAG port 123 on JTAG POD 120, and communication link 125 is coupled at the other end to second JTAG port 127 on SUT 130. As further illustrated, SUT 130 comprises processor 135, which within the disclosed embodiment, is subjected to being under test along with the JTAG IEEE 1149.1 interface to processor 135.

Figure 1B:
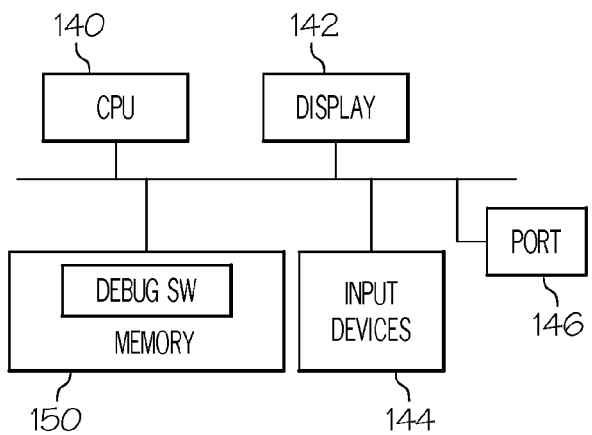
FIG. 1B is a block diagram illustrating hardware and software components of an example host system according to one embodiment of the invention.

FIG. 1B illustrates internal component of example host system 110, which may be utilized to provide the debugging features and user interfacing features of the invention, as described below. According to the invention, host system 110 may be a standard data processing system with central processing unit (CPU) 140, display device 142, and one or more input devices 144 (e.g., keyboard, mouse, and/or other user input device). Host system 110 also comprises memory 148, within which debugging software 150 is illustrated. In one embodiment, debugging software 150 is described as preexisting debugging software, to indicate that host system 110 is a standard host system executing debugging software that is ultimately utilized to debug SUT 130 utilizing the specific, novel methods described herein. Thus, host system 110 is a platform with the actual debugging software executing thereon. Host system 110 also comprises communication port 146 and provides software/hardware functions for generating communication packets (referred to hereinafter as debug packets because the majority of packets under consideration are related to the debugging operations performed at SUT 130) issued to perform debugging functions on SUT 130. Host system 110 and specifically debugging software 146 executing on host system 110 communicate to JTAG POD 120 through communication link/device/medium 115 utilizing communication port 146. In the illustrative embodiment, communication link 115 supports a Host/Client type communication.

During execution of debugging software 148 and other functional applications, host system 110 provides high-level commands and user interfaces, which are implemented on the user-level. Host system 110 communicates these user-level commands to JTAG POD 120 using a communication protocol or packet transfer via communication link 115. The communication packets (debug packets) may be received from one or more different types of communication paths/mechanisms and associated protocol, such as Ethernet, USB, 802.11, and Bluetooth, for example. The combination of communication mechanism and associated protocol is collectively referred to herein as communication link 115. Further, in one embodiment, the communication packets each contain a command field followed by data supporting the particular command, and the communication packets are designed to create minimal traffic between host system 110 and SUT 130.

Figure 1C:
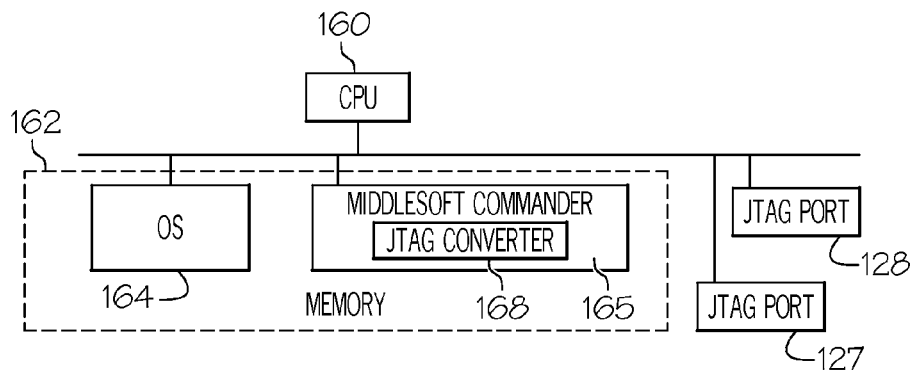
FIG. 1C is a block diagram illustrating the internal hardware and software components of the POD, including Middlesoft Commander and associated components, in accordance with one embodiment of the invention.

Turning now to FIG. 1C, which illustrates an internal, component-level view of JTAG POD 120 equipped with Middlesoft Commander functionality, according to one embodiment of the invention. JTAG POD 120 is a JTAG-enabled/JTAG-capable system controller, which comprises hardware and functional software components and exhibits the various functional features of a system controller. As utilized herein, a system controller (and therefore JTAG POD 120) refers to a device that is able to perform many control functions over SUT 130, all within one device. These control functions include: power on SUT; change voltages and frequencies of SUT; interact with processor 135 of SUT; among others.

According to the illustrative embodiment, JTAG POD 120 comprises a CPU 160 and memory 162 within which operating system (OS) 164 is illustrated. The OS 164 may be an embedded Linux, in one embodiment. However, while the illustrative embodiment is described with OS 164 being embedded Linux, it is understood that other OSes may be utilized in POD 120 and that the use of embedded Linux is provided solely for illustration. JTAG POD 120 also comprises at least one JTAG port 123 by which JTAG POD links to JTAG capable external devices (namely SUT 130) to enable communication with these external devices. JTAG POD 120 is capable of self-initialization.

Notably, in addition to the above described internal hardware components of POD 120, various features of the invention are provided as software application code stored within some memory storage 162 and executed by CPU 160. Key among the software code are code for OS 164 (such as embedded Linux), middleware application code 170, and code for providing the functionality of Middlesoft Commander 165. For simplicity, the collective body of code that enables the Middlesoft Commander functionality is referred to herein as Middlesoft Commander (or Middlesoft Commander utility) 165. Middlesoft Commander 165 is the actual application that supports the communication to and from the external devices (e.g., SUT 120) via the JTAG ports 123, 127, as described in greater details below.

According to the illustrative embodiment, the software that interfaces with the IEEE JTAG 1149.1 interface and the debug software is referred to as middleware application 170. Thus, JTAG POD 120 further comprises middleware application 170, which is provided to complete the specific task of ensuring that JTAG POD 120 is able to communicate with Middlesoft Commander 165. According to the invention, middleware application 170 is able to interface to any application that supports an IEEE 1149.1 interface, within a single solution. Additionally, JTAG POD 120 includes its own BIOS (basic input output system) and OS to enable JTAG POD 120 to get ready for operation, and to enable JTAG POD 120 to self-initialize. JTAG POD 120 contains the IEEE 1149.1 interfaces, and JTAG POD 120 controls the JTAG interface and the protocols associated with the JTAG interface.

According to the illustrative embodiment, when CPU 160 executes OS 164 and Middlesoft Commander 210, the utility enables POD 120 to complete a series of functional processes that together controls the debugging operation conducted at SUT 130. These various processes are described below and illustrated by FIG. 2.

As described herein, Middlesoft Commander 165 is a software utility that is provided on a hardware POD 120, and the hardware POD 120 is a system controller that interfaces with a JTAG IEEE 1149.1 capable device (i.e., SUT 130) and also interfaces with host system 110. In the illustrative embodiment, Middlesoft Commander 165 is utilized to test certain features of processor 135 of SUT 130. The actual debug software runs on host system 110, and the debug software 150 includes functionality for mating with existing debug software front end to Middlesoft Commander 165 to create a full software solution.

As shown by FIG. 1A, Middlesoft Commander 165 interfaces with first communication link 115 to host system 110. Middlesoft Commander 165 also interfaces (via a JTAG ports 123 and 127 and second communication link 125) to SUT 130. Thus, the connection of POD 120 to SUT 130 is completed via respective JTAG ports 123 and 127. With these connections in place, Middlesoft commander 210 comprises code that when executed performs the following two primary functions. In the illustrative embodiment, both functions are essential (i.e., required to be provided by Middlesoft Commander 165) for Middlesoft Commander 165 to operate successfully as a debugging support tool for a JTAG device. The first function provided by Middlesoft Commander 165 involves receiving and operating on incoming debug packets from host system 110, which packets are transmitted on the interface created by communication link between host system 110 and JTAG POD 120. When the communication packets arrive at POD 120, Middlesoft Commander 210 deciphers the packets and converts the request within the packets to high and/or low level JTAG commands. Middlesoft Commander 210 then forwards these generated JTAG commands to SUT 130. Later, when data is received from SUT 130, Middlesoft Commander 210 restructures the data into packets to be sent back to host system 110.

In one embodiment, Middlesoft Commander 165 is utilized to test certain features processor 135, which may be a conventional processor. The generated JTAG commands enable access to registers, arrays and rings of SUT 130, specifically processor 135 of SUT 130. Also, in one embodiment, the JTAG commands are designed to trigger a return of the generated JTAG data from the SUT to Middlesoft Commander.

Those of ordinary skill in the art will appreciate that the hardware depicted in FIGS. 1A-1C may vary. For example, SUT 130 may be a fully functional data processing system, and other computer devices may be used in addition to or in place of the hardware depicted. Thus, the depicted example is not meant to imply architectural limitations with respect to the present invention. As another example, host system 110 depicted in FIG. 1 may be an IBM eServer pSeries system, a product of International Business Machines Corporation in Armonk, N.Y., running the Advanced Interactive Executive (AIX) operating system or LINUX operating system.

Figure 2A:
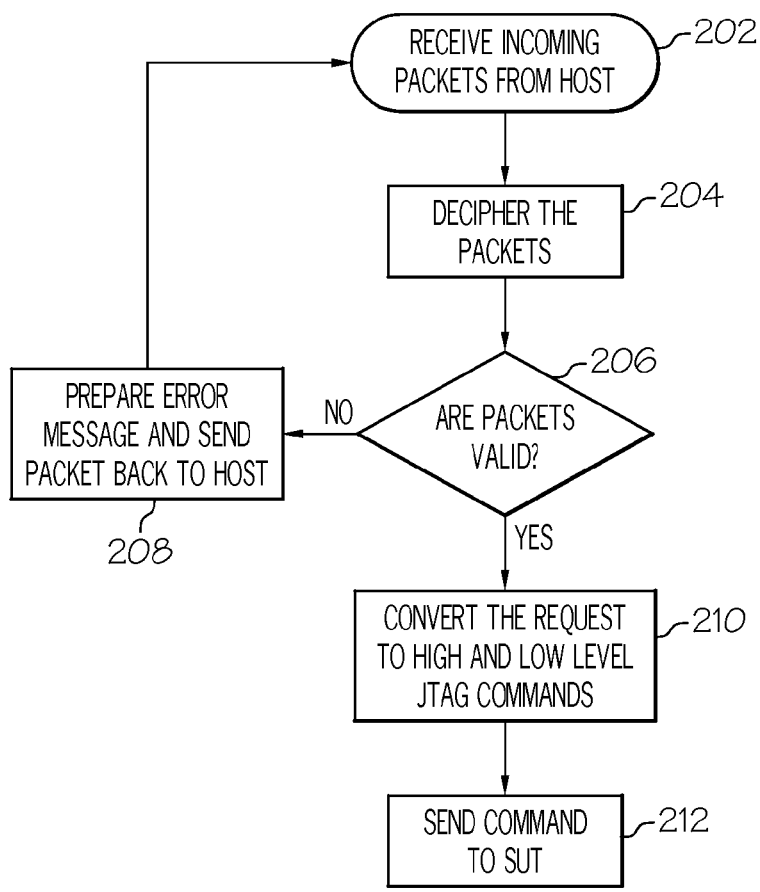
FIGS. 2A-2B provide a flow chart illustrating processing steps during operation of Middlesoft Commander when implementing debugging operations on the SUT, according to one embodiment of the invention.

FIG. 2A illustrates the processing completed during a debugging operation of a JTAG-capable SUT utilizing Middlesoft Commander, according to one embodiment. The process begins at block 202, at which Middlesoft Commander 165 receives incoming debug packets from host system 110. When the packets are received, Middlesoft Commander 165 deciphers the packets, at block 204, and determines, at block 206, whether the packets are valid. If the packets are not valid, Middlesoft Commander 165 generates an error message and sends the error message back to host system 110 (identifying the problem packets). However, if the packets are valid, Middlesoft Commander 165 converts the request(s) within the packets into high and/or low level JTAG commands, as shown at block 210. Then, Middlesoft Commander 165 forwards the command(s) to SUT 130.

Figure 2B:
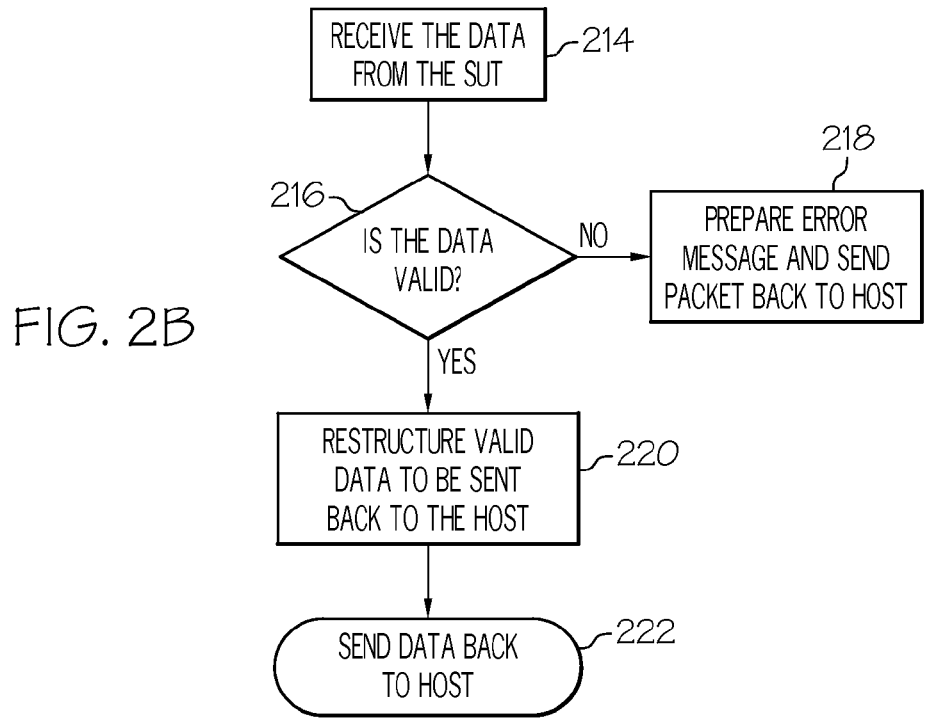

A second part of the processing of Middlesoft Commander 165 is shown by FIG. 2B, which begins at block 214 when Middlesoft Commander 165 receives data from SUT 130. When data is received from SUT 130, Middlesoft Commander 165 determines whether the data is valid, as indicated at block 216. When the data is not valid, Middlesoft Commander 165 again generates an error message, which Middlesoft Commander 165 forwards to host system 110 (??), as shown at block 218. However, assuming the data evaluates as valid data, Middlesoft Commander 165 restructures the valid data into packets (i.e., from JTAG to user-level data) to be sent back to host system 110, as stated at block 220. Following, at block 222, Middlesoft Commander 165 sends the data back to the host system 222 the created packets.

Middlesoft Commander 165 is designed to run on the POD 120 that contains the IEEE 1149.1 interface, while the debug software is designed to run on host system 110. In one embodiment, Middlesoft Commander 165 may be provided user-level operational features via host system 110. For example, a user of host system 110 may be provided with a GUI (perhaps associated with the debug software) to enable the user to interactively conduct communication with Middlesoft Commander 165. Further, the user may also be able to interactively complete an interruption of the data that is received back from Middlesoft Commander.

As a final matter, it is important that while an illustrative embodiment of the present invention has been, and will continue to be, described in the context of a fully functional computer system with installed management software, those skilled in the art will appreciate that the software aspects of an illustrative embodiment of the present invention are capable of being distributed as a program product in a variety of forms, and that an illustrative embodiment of the present invention applies equally regardless of the particular type of signal bearing media used to actually carry out the distribution. Examples of signal bearing media include recordable type media such as floppy disks, thumb drives, hard disk drives, CD ROMs, DVDs, and transmission type media such as digital and analogue communication links.

While the invention has been particularly shown and described with reference to a preferred embodiment, it will be understood by those skilled in the art that various changes in form and detail may be made therein without departing from the spirit and scope of the invention.

What is claimed is:

1. A system comprising:
    a host system having a debugging software executing thereon;
    a device under test (DUT), which is JTAG capable, said device having one or more operational attributes and parameters that are determinable via a JTAG-coded debug request/command; and
    a system controller having a software utility for enabling a Middlesoft Commander, said Middlesoft Commander comprising executable code for providing the following functionality:
       receiving from the host system one or more communication packets, said communication packets each comprising a command field followed by data supporting the particular command;
       deciphering the received communication packets;
       converting a request within each deciphered packet into high and low level JTAG commands;
       forwarding the generated JTAG commands to the SUT;
       re-structuring output JTAG data received from the debug-analysis of the SUT into return packets decipherable/recognizable by the host system;
       forwarding the return packets to the host system;
    wherein said system controller is a JTAG POD and further comprises:

a middleware application for enabling access and control to JTAG interfaces and protocols on the system controller and which (a) interfaces with both an IEEE JTAG 1149.1 interface of the JTAG POD and the debug software and (b) facilitates communication between other components of JTAG POD and Middlesoft Commander; and an embedded operating system (OS) and a basic input output system (BIOS), which provide operating code for enabling self-initialization of the system controller.

2. The system of claim 1, wherein said system controller further comprises:

a CPU, which executes the OS, middleware application, and Middlesoft Commander to enable the system controller to complete a series of functional processes that together controls a debugging operation conducted at the SUT from the host system.

3. The system of claim 1, wherein said system controller is a JTAG POD and further comprises:

at least one IEEE 1149.1 (JTAG) interface;

logic for controlling both the JTAG interface and the protocols associated with the JTAG interface;

logic for interfacing with said host system via a first communication link over which standard user-level-generated communication packets are transmitted;

logic for interfacing with the SUT via a JTAG communication link coupled to the at least one JTAG interface over which JTAG communication packets are transmitted;

wherein a pair of JTAG interfaces bridges a connection between the POD and the SUT; and wherein connection of the POD to the SUT is completed via respective JTAG ports on the POD and the SUT.

4. The system of claim 1, wherein said Middlesoft Commander further comprises code for providing the functionality of:

when an incoming communication packet is received from the host system, automatically deciphering the received packets to determine if the received packets are valid;

when the received packets are not valid, generating a first type error message; and forwarding the first type error message back to the host system;

when the received packets are valid, dynamically converting the received packets into at least one of a high and a low level JTAG command(s); and forwarding the JTAG command(s) to the SUT.

5. The system of claim 1, wherein said Middlesoft Commander further comprises code for providing the functionality of:

when JTAG data is received from SUT, automatically determining whether the data is valid;

when the JTAG data is not valid, generating a second-type error message; and forwarding the second-type error message to the host system when the JTAG data is valid, dynamically restructuring the valid data into return packets that are readable by the host system; and forwarding the return packets back to the host system.

6. The system of claim 1, wherein:

said POD is a physical device operating as a system controller that interfaces with a JTAG IEEE 1149.1 capable device and a host system; and said system controller further provides operating functional control including: powering on SUT; changing voltages and frequencies of SUT; and interacting with a processor of the SUT.

7. The system of claim 1, wherein:

said debug software being executed on the host system includes means for mating with existing debug software front end to Middlesoft Commander to create a full software solution; and user level access to Middlesoft Commander is provided via the host system, said user level access including providing a graphical user interface (GUI) to enable the user to interactively communicate with Middlesoft Commander and enabling the user to interrupt the data that is received back from Middlesoft Commander.

8. The system of claim 1, wherein:

the device under test is a processor of the connected SUT and Middlesoft Commander completes a test of specific operating attributes/parameters of the processor, wherein the generated JTAG commands enable access to registers, arrays and rings of SUT; and the generated JTAG commands trigger a return of the detected JTAG data from the SUT to Middlesoft Commander.

9. A system controller comprising:

a first interface for coupling the system controller to a host system and receiving communication packets from the host system and transmitting return packet and error messages to the host system;

a second JTAG-enabled interface for coupling the system controller to a JTAG-capable device and for transmitting JTAG commands to and receiving JTAG data from the JTAG-capable device; and a Middlesoft Commander, said Middlesoft Commander comprising executable code for providing the following functionality;

receiving from the host system one or more communication packets, said communication packets each comprising a command field followed by data supporting the particular command;

deciphering the received communication packets;

converting a request within each deciphered packet into high and low level JTAG commands;

forwarding the generated JTAG commands to the SUT;

re-structuring output JTAG data received from the debug-analysis of the SUT into return packets decipherable/recognizable by the host system;

forwarding the return packets to the host system;

wherein said system controller is a JTAG POD and further comprises:

a middleware application for enabling access and control to JTAG interfaces and protocols on the system controller and which (a) interfaces with both an IEEE JTAG 1149.1 interface of the JTAG POD and the debug software and (b) facilitates communication between other components of JTAG POD and Middlesoft Commander; and an embedded operating system (OS) and a basic input output system (BIOS), which provide operating code for enabling self-initialization of the system controller.

10. The system controller of claim 9, wherein said system controller further comprises:

a CPU, which executes the OS, middleware application, and Middlesoft Commander to enable the system controller to complete a series of functional processes that together controls a debugging operation conducted at the SUT from the host system.

11. The system controller of claim 9, further comprising:

at least one IEEE 1149.1 (JTAG) interface;

logic for controlling both the JTAG interface and the protocols associated with the JTAG interface;

logic for interfacing with said host system via a first communication link over which standard user-level-generated communication packets are transmitted;
logic for interfacing with the SUT via a JTAG communication link coupled to the at least one JTAG interface over which JTAG communication packets are transmitted;
wherein a pair of JTAG interfaces bridges a connection between the JTAG POD and the SUT; and
wherein connection of the JTAG POD to the SUT is completed via respective JTAG ports on the POD and the SUT.

12. A system controller comprising:
a first interface for coupling-the system controller to a host system and receiving communication packets from the host system and transmitting return packet and error messages to the host system;
a second JTAG-enabled interface for coupling the system controller to a JTAG-capable device and for transmitting JTAG commands to and receiving JTAG data from the JTAG-capable device; and
a Middlesoft Commander, said Middlesoft Commander comprising executable code for providing the following functionality:
receiving from the host system one or more communication packets, said communication packets each comprising a command field followed by data supporting the particular command;
deciphering the received communication packets;
converting a request within each deciphered packet into high and low level JTAG commands;
forwarding the generated JTAG commands to the SUT;
re-structuring output JTAG data received from the debug analysis of the SUT into return packets decipherable/recognizable by the host system;
forwarding the return packets to the host system;
when an incoming communication packet is received from the host system, automatically deciphering the received packets to determine if the received packets are valid;
when the received packets are not valid:
generating a first type error message; and
forwarding the first type error message back to the host system;
when the received packets are valid:
dynamically converting the received packets into at least one of a high and a low level JTAG command(s); and
forwarding the JTAG command(s) to the SUT.

13. A system controller comprising:
a first interface for coupling the system controller to a host system and receiving communication packets from the host system and transmitting return packet and error messages to the host system;
a second JTAG-enabled interface for coupling the system controller to a JTAG-capable device and for transmitting-JTAG commands to and receiving JTAG data from the JTAG-capable device; and
a Middlesoft Commander, said Middlesoft Commander comprising executable code for providing the following functionality
receiving from the host system one or more communication packets, said communication packets each comprising a command field followed by data supporting the particular command;
deciphering the received communication packets;
converting a request within each deciphered packet into high and low level JTAG commands;
forwarding the generated JTAG commands to the SUT;
re-structuring output JTAG data received from the debug analysis of the SUT into return packets decipherable/recognizable by the host system;
forwarding the return packets to the host system;
when JTAG data is received from SUT, automatically determining whether the data is valid;
when the JTAG data is not valid:
generating a second-type error message; and
forwarding the second-type error message to the host system when the JTAG data is valid:
dynamically restructuring the valid data into return packets that are readable by the host system; and
forwarding the return packets back to the host system.

14. The system controller of claim 9, wherein:
said POD is a physical device operating as a system controller that interfaces with a JTAG IEEE 1149.1 capable device and a host system;
said system controller further provides operating functional control including: powering on SUT; changing voltages and frequencies of SUT; and interacting with a processor of the SUT;
the device under test is a processor of the connected SUT and Middlesoft Commander completes a test of specific operating attributes/parameters of the processor, wherein the generated JTAG commands enable access to registers, arrays and rings of SUT; and
the generated JTAG commands trigger a return of the detected JTAG data from the SUT to Middlesoft Commander.

15. A computer program product comprising:
a computer readable storage medium; and
program code on the computer readable storage medium that when executed within a system controller operating as a JTAG POD enables the functions of:
receiving from the host system one or more communication packets, said communication packets each comprising a command field followed by data supporting the particular command;
when an incoming communication packet is received from the host system, automatically deciphering the received packets to determine if the received packets are valid;
when the received packets are not valid,
generating a first type error message; and
forwarding the first type error message back to the host system;
when the received packets are valid, dynamically converting the received packets into at least one of a high and a low level JTAG command(s); and
forwarding the generated JTAG commands to the SUT.

16. The computer program product of claim 15, wherein said program code further comprises code for providing the functions of:
when JTAG data is received from SUT, automatically determining whether the data is valid;
when the JTAG data is not valid, generating a second-type error message; and
forwarding the second-type error message to the host system
when the JTAG data is valid, dynamically restructuring the valid JTAG data into return packets that are readable by the host system; and
forwarding the return packets back to the host system.

17. The computer program product of claim 15, wherein said code further comprises code for:
controlling both the JTAG interface and the protocols associated with the JTAG interface;

interfacing with said host system via a first communication link over which standard user-level-generated communication packets are transmitted; and interfacing with the SUT via a JTAG communication link coupled to the at least one JTAG interface over which JTAG communication packets are transmitted;

wherein a pair of JTAG interfaces bridges a connection between the POD and the SUT, and wherein connection of the POD to the SUT is completed via respective JTAG ports on the POD and the SUT.

* * * * *